US012793765B2

(12) United States Patent
Hong et al.

(10) Patent No.: US 12,793,765 B2
(45) Date of Patent: Nov. 10, 2026

(54) MEMORY DEVICE

(71) Applicant: Samsung Electronics Co., Ltd., Suwon-si (KR)

(72) Inventors: Seungki Hong, Suwon-si (KR); Hoseok Seol, Suwon-si (KR); Youngjin Kim, Suwon-si (KR); Ki-Heung Kim, Suwon-si (KR); Wonho Choi, Suwon-si (KR); Jinyong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 18/961,399

(22) Filed: Nov. 26, 2024

(65) Prior Publication Data

US 2025/0349344 A1 Nov. 13, 2025

(30) Foreign Application Priority Data

May 8, 2024 (KR) ........................ 10-2024-0060648

(51) Int. Cl.
*G11C 11/408* (2006.01)

(52) U.S. Cl.
CPC ...... *G11C 11/4087* (2013.01); *G11C 11/4085* (2013.01)

(58) Field of Classification Search
CPC ............................ G11C 11/4087; G11C 11/40
USPC ..................................................... 365/230.06
See application file for complete search history.

(56) References Cited

U.S. PATENT DOCUMENTS 6,067,613 A * 5/2000 Balmer ............... G06F 9/30032 712/E9.034
2006/0083078 A1* 4/2006 Sforzin .................. G11C 16/24 365/189.06
2008/0278923 A1* 11/2008 Losavio ................ H10W 90/00 361/803
2011/0261628 A1 10/2011 Keeth et al.
2019/0228816 A1 7/2019 Raad et al.
2021/0272612 A1 9/2021 Sohn et al.
2022/0238178 A1 7/2022 Kim et al.
2024/0036745 A1 2/2024 Hong

FOREIGN PATENT DOCUMENTS

KR 10-2020-0092415 A 8/2020

* cited by examiner

*Primary Examiner* — Muna A Techane
(74) *Attorney, Agent, or Firm* — Muir Patent Law, PLLC

(57) ABSTRACT

A memory device according to an embodiment of the present disclosure may include a memory bank including a plurality of rows, a row decoder including a plurality of row blocks associated with the plurality of rows and configured to activate a specific row block of the plurality of row blocks based on a local row group address and a plurality of local MUX activation signals, an interface circuit configured to receive a global row group address, a plurality of global MUX activation signals, and a decoded bank address, generate the local row group address and the plurality of local MUX activation signals, and transmit the local row group address and the plurality of local MUX activation signals to the row decoder, and a row block select circuit configured to generate the global row group address and the plurality of global MUX activation signals based on a decoded row address.

20 Claims, 14 Drawing Sheets

MEMORY DEVICE

CROSS-REFERENCE TO RELATED APPLICATION(S)

This application claims priority under 35 U.S.C. § 119 to Korean Patent Application No. 10-2024-0060648, filed in the Korean Intellectual Property Office on May 8, 2024, the disclosure of which is incorporated by reference herein in its entirety.

BACKGROUND a) Field

The present invention relates to a memory device.

b) Description of Related Art

A memory device such as a dynamic random access memory may include a row decoder that activates one of a plurality of rows based on a row address. The row decoder may include a block MUX that activates a row block of one of a plurality of rows. The row decoder may include the same number of block MUX as the number of row blocks in order to enable each row block, but in this case, the area and power consumption of the row decoder may be significantly increased.

SUMMARY

Example embodiments provide a memory device including a row decoder having a small area and low power consumption.

A memory device according to an embodiment of the present disclosure may include a first memory bank including a plurality of first rows, a first row decoder including a plurality of row blocks associated with the plurality of first rows and configured to activate a specific row block of the plurality of row blocks based on a local row group address and a plurality of local MUX activation signals, an interface circuit configured to receive a global row group address, a plurality of global MUX activation signals, and a decoded bank address, to generate the local row group address and the plurality of local MUX activation signals in response to the global row group address, the plurality of global MUX activation signals, and the decoded bank address, and to transmit the local row group address and the plurality of local MUX activation signals to the first row decoder, and a row block select circuit configured to generate the global row group address and the plurality of global MUX activation signals based on a decoded row address.

A memory device according to an embodiment of the present disclosure may include a memory cell array including a first memory bank and a second memory bank, the first memory bank including a first set of rows and the second memory bank including a second set of rows, a first row decoder including a first set of row blocks associated with the first set of rows, and configured to activate one of the first set of row blocks based on a local row group address and a plurality of local MUX activation signals, a second row decoder including a second set of row blocks associated with the second set of rows, and configured to activate one of the second set of row blocks based on the local row group address and the plurality of local MUX activation signals, an interface circuit configured to receive a global row group address, a plurality of global MUX activation signals, and a decoded bank address, to generate the local row group address and the plurality of local MUX activation signals in response to the global row group address, the plurality of global MUX activation signals, and the decoded bank address, and to transmit the local row group address and the plurality of local MUX activation signals to the first row decoder or the second row decoder, and a row block select circuit configured to generate the global row group address and the plurality of global MUX activation signals based on a decoded row address.

A memory device according to an embodiment of the present disclosure may include a memory cell array including a plurality of rows, a row decoder including a plurality of row blocks associated with the plurality of rows and configured to activate a specific row block of the plurality of row blocks based on a row group address and a plurality of MUX activation signals, and a row block select circuit configured to generate the row group address and the plurality of MUX activation signals based on a decoded row address. The plurality of row blocks are divided into a plurality of groups. Each of the plurality of groups includes the activated specific row block in response to one of the plurality of MUX activation signals.

According to some aspects of the present disclosure, the memory device may include the row block select circuit integrating the block MUXs using the continuity of row address coding, and the row block select circuit may be disposed in the pad region of the memory device. Accordingly, the number of block MUXs present in the memory device can be reduced, and the total area of the row decoder and the memory device can be reduced. In addition, by reducing the area of the row decoder and memory device, activation power required for the row activation can be reduced, and unnecessary leakage current and signal skew that can occur when the row decoder occupies a large area can be reduced.

According to some aspects of the present disclosure, using the continuity of row address coding, the number of global MUXs can be implemented in a minimum unit that is smaller than the total number of row blocks. Accordingly, scalability of the memory device including the block MUXs and the row blocks can be secured.

Various and beneficial advantages and effects of the present invention are not limited to those described above, and can be more easily understood in the course of describing specific aspects of the present disclosure.

DETAILED DESCRIPTION

Hereinafter, certain aspects of the present disclosure will be described as follows with reference to the accompanying drawings.

DRAM will be used as an example of a semiconductor memory device for explaining features and functions of the present disclosure. However, those skilled in the art will be able to easily understand the advantages of the present disclosure according to the contents described herein. In addition, the present disclosure may be implemented or applied in other aspects. The detailed description may be modified or changed according to the viewpoint and application without significantly deviating from the scope, technical idea, and purpose of the present invention.

Figure 1:
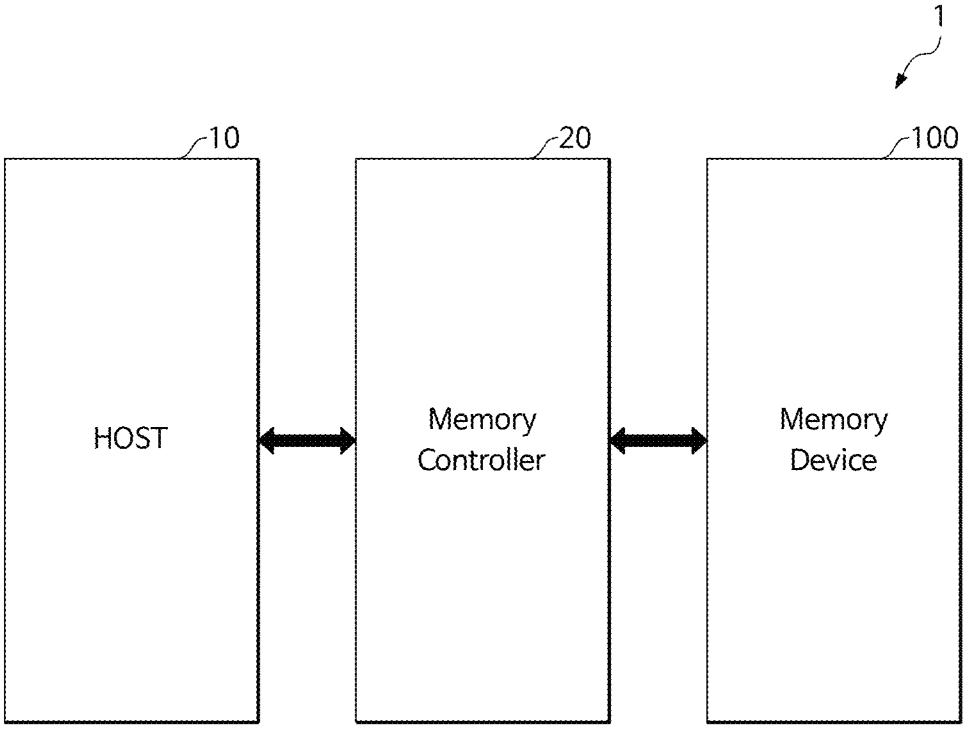
FIG. 1 is a diagram illustrating an example of an electronic system according to an embodiment.

FIG. 1 is a diagram illustrating an example of an electronic system 1 according to an embodiment. The electronic system 1 may include a host 10 and a memory system. The memory system may include a memory controller 20 and a memory device 100. FIG. 1 illustrates that there are one host 10, one memory controller 20, and one memory device 100, but the present invention is not limited thereto, and there may be a plurality of these.

The host 10 may communicate with the memory system using an interface protocol such as peripheral component interconnect-express (PCI-E), advanced technology attachment (ATA), serial ATA (SATA), parallel ATA (PATA), or serial attached SCSI (SAS). In addition, the interface protocols between the host 10 and the memory system are not limited to the examples described above, and may be one of other interface protocols such as Universal Serial Bus (USB), Multi-Media Card (MMC), Enhanced Small Disk Interface (ESDI), Integrated Drive Electronics (IDE), etc.

The memory controller 20 may be at least one of a memory controller for controlling the memory device 100, a system-on-chip (SoC) such as an application processor (AP), a central processing unit (CPU), a digital signal processor (DSP), and a graphics processing unit (GPU), but the technical idea of the present invention is not limited thereto.

The memory controller 20 controls the overall operation of the memory system and controls the overall data exchange between the host 10 and the memory device 100. For example, the memory controller 20 may control the memory device 100 to write or read data according to a request from the host 10. In addition, the memory controller 20 may apply operation commands for controlling the memory device 100 to control the operation of the memory device 100.

The memory device 100 may be a volatile memory device such as a Dynamic Random Access Memory (DRAM), a Synchronous Dynamic Random Access Memory (SDRAM), a Double Data Rate (DDR) DRAM, DDR SDRAM, a Low Power Double Data Rate (LPDDR) SDRAM, a Graphics Double Data Rate (GDDR) SDRAM, a Rambus Dynamic Random Access Memory (RDRAM), a Static Random Access Memory (SRAM), etc. Alternatively, the memory device 100 may also be implemented in nonvolatile memory devices such as a resistive RAM (RRAM), a phase change memory (PRAM), a magnetoresistive memory (MRAM), a ferroelectric memory (FRAM), a spin injection magnetization inversion memory (STT-RAM). Certain examples are described herein based on a volatile memory including a DRAM, but the technical idea of the present invention is not limited thereto.

Each of the host 10, the memory controller 20, and the memory device 100 may transmit and receive signals and/or data. The host 10, the memory controller 20, and the memory device 100 may transmit and receive signals and/or data through signal lines and/or buses. Alternatively, the memory controller 20 and the memory device 100 may be connected to each other through corresponding command pins, address pins, and data pins, respectively, and the memory controller 20 may input an address to the memory device 100 through the address pins, input data to the memory device 100 through the data pins, or output data from the memory device 100 based on a request from the host 10.

Figure 2:
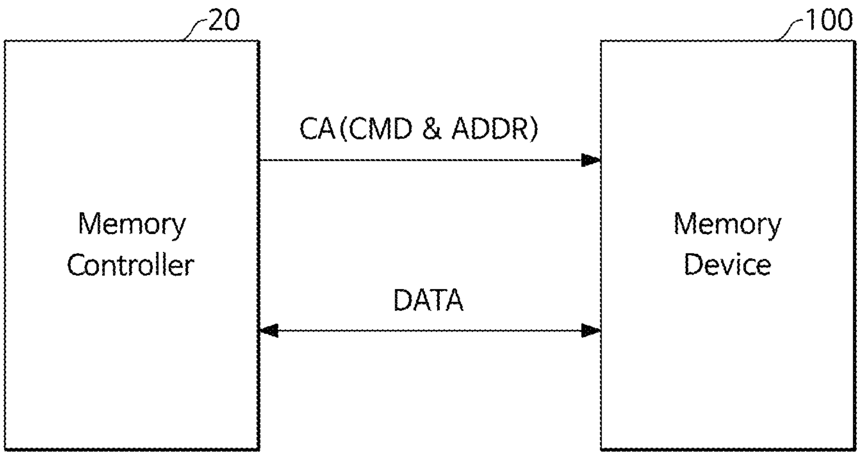
FIG. 2 is a diagram illustrating an example of a memory system according to an embodiment.

FIG. 2 is a diagram illustrating an example of the memory system according to an embodiment. Referring to FIG. 1, the memory system may include the memory controller 20 and the memory device 100.

The memory controller 20 may provide various signals to the memory device 100 to control the overall operation of the memory device 100. For example, the memory controller 20 may control the memory access operation of the memory device 100 such as read and write. The memory controller 20 may provide a command and address CA signal to the memory device 100 to write the data DATA to or read the data DATA from the memory device 100. The command and address CA signal may include a command CMD and an address ADDR. Herein, for convenience of description, the terms of the command and address CA signal and a command and address CA may be used interchangeably.

The memory controller 20 may generate various kinds of command and address CA signals to control the memory device 100. For example, the memory controller 20 may generate a bank request corresponding to a bank operation that switches the states of memory banks included in the memory array to read or write data DATA. For example, the bank request may include an active request for switching the states of the memory banks included in the memory array to an active state. In response to the active request, the memory device 100 may activate a row, that is, a word line included in the memory banks. The bank request may include a precharge request for switching the memory banks from the active state to a standby state after reading or writing the data DATA is complete.

In addition, the memory controller 20 may generate an I/O request (e.g., a CAS request) for performing the read or write operation for the data DATA with respect to the memory device 100. For example, the input and output request may include a read request for reading data DATA from activated memory banks. The input and output request may include a write request for writing data DATA to the activated memory banks. In addition, the memory controller 20 may generate a refresh command for controlling a refresh operation for the memory banks. However, the types of command and address CA signals described herein are merely examples, and other types of command and address CA signals may be present.

The memory controller 20 may transmit the generated command and address CA signal to the memory device 100. The memory controller 20 may transmit the command and address CA to the memory device 100 through the command and address bus of the memory bus.

Alternatively, the memory controller 20 may transmit a command CMD through a command transmission line of the command pin, and transmit an address ADDR through an address transmission line of the address pin.

The memory device 100 may input and output the data DATA based on the command and address CA signal. The memory device 100 may output the data DATA requested to be read by the memory controller 20 to the memory controller 20, or store the data DATA requested to be written by the memory controller 20 in a memory cell of the memory device 100.

The data DATA may be transmitted from the memory controller 20 to the memory device 100 or transmitted from the memory device 100 to the memory controller 20 through a data bus of a memory bus that includes bidirectional signal lines. Alternatively, the data DATA may be transmitted from the memory controller 20 to the memory device 100 or from the memory device 100 to the memory controller 20 through the data pin.

Although not illustrated in FIG. 2, the memory controller 20 may transmit various signals other than the command and address CA signal to the memory device 100. For example, the memory controller 20 may transmit a clock CLK signal to the memory device 100 through a clock signal line of the memory bus. The clock CLK signal may include a clock related to a transmission rate of the command and address CA signal applied to perform data input and output operation. As another example, the memory controller 20 may transmit, to the memory device 100, a chip select CS signal for selecting a specific memory device through the chip select line CSL of the memory bus.

Figure 3:
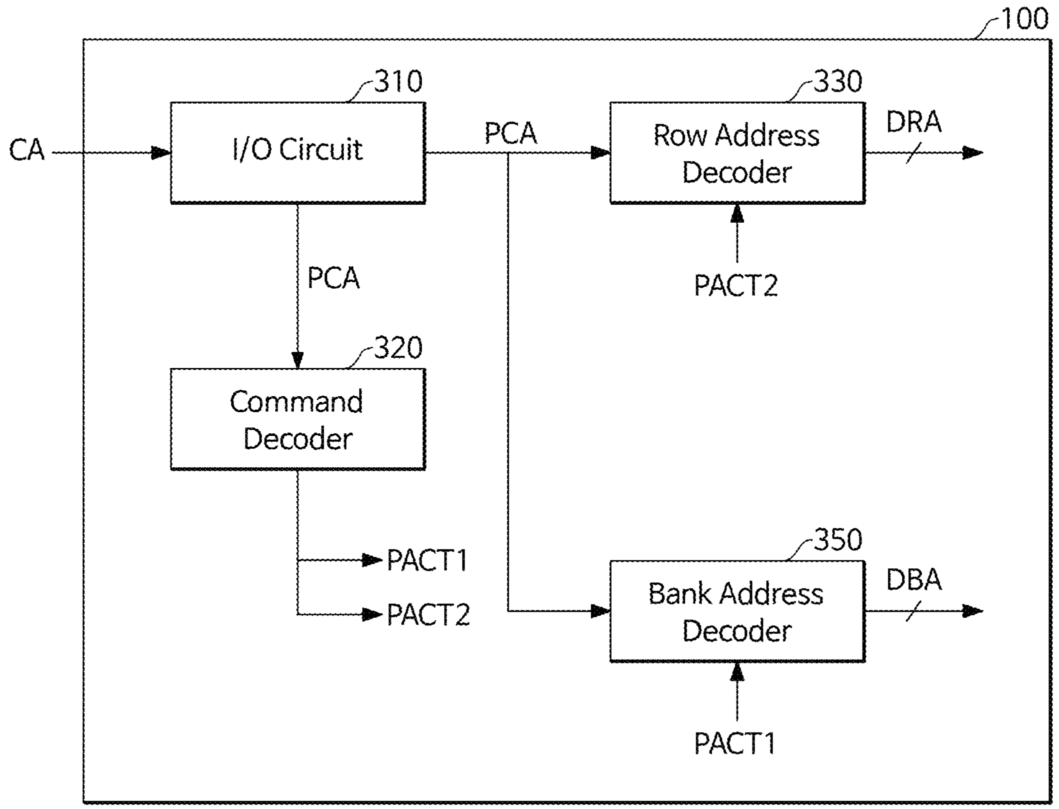
FIGS. 3 and 4 are diagrams illustrating an example of a memory device according to embodiments.
Figure 4:
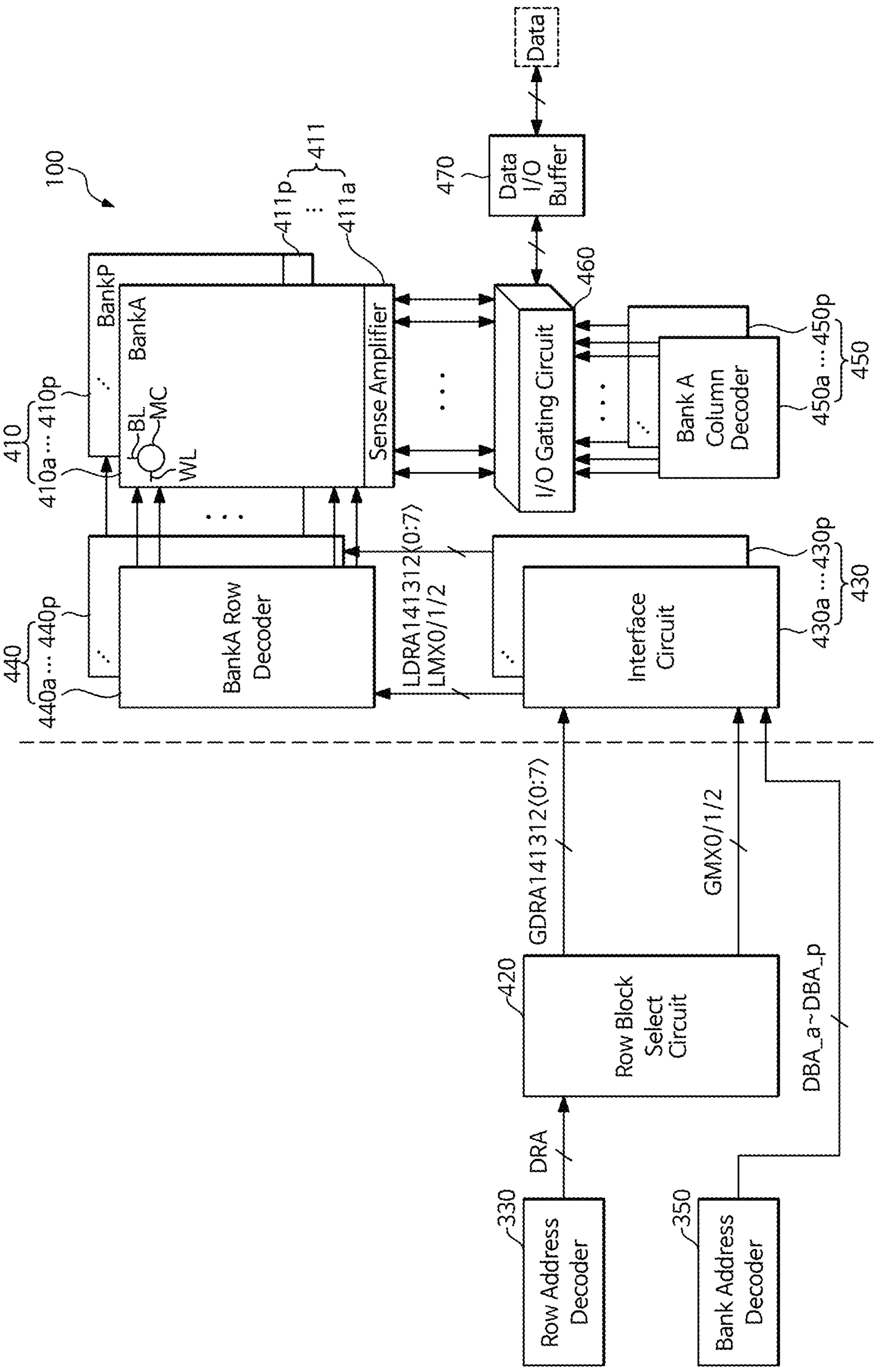

FIGS. 3 and 4 are diagrams illustrating an example of the memory device 100 according to embodiments. Referring to FIG. 3, the memory device 100 may receive a command and address CA signal and generate a decoded row address (DRA) and a decoded bank address (DBA) based on the received command and address CA signal. To this end, the memory device 100 may include an I/O circuit 310, a command decoder 320, a row address decoder 330, and a bank address decoder 350. These configurations of the memory device 100 may be formed in a PAD region of the memory device 100.

The I/O circuit 310 may generate an internal command and address PCA signal based on the received command and address CA signal. Herein, for convenience of description, the terms of the internal command and address PCA signal and an internal command and address PCA may be used interchangeably. For example, the internal command and address PCA signal may include an internal command PCMD and an internal address PADDR. The I/O circuit 310 may transmit the generated internal command and address PCA signal to the command decoder 320, the row address decoder 330, and the bank address decoder 350.

The command decoder 320 may generate an internal control signal based on the internal command and address PCA. For example, the command decoder 320 may receive the internal command and address PCA signal from the I/O circuit 310 and generate a first internal control signal PACT1 and a second internal control signal PACT2 based on the internal command and address PCA. The command decoder 320 may transmit the first internal control signal PACT1 and/or the second internal control signal PACT2 to the row address decoder 330 and the bank address decoder 350.

The row address decoder 330 may generate a decoded row address DRA based on the internal command and address PCA signal and the internal control signal. For example, the row address decoder 330 may receive the internal command and address PCA signal from the I/O circuit 310 and the second internal control signal PACT2 from the command decoder 320. In this case, the row address decoder 330 may generate the decoded row address DRA based on the internal command and address PCA signal and the second internal control signal PACT2.

The bank address decoder 350 may generate a decoded bank address DBA based on the internal command and address PCA signal and the internal control signal. For example, the bank address decoder 350 may receive the internal command and address PCA signal from the I/O circuit 310 and receive the first internal control signal PACT1 from the command decoder 320. In this case, the bank address decoder 350 may generate the decoded bank address DBA based on the internal command and address PCA signal and the first internal control signal PACT1.

Referring to FIG. 4, the memory device 100 may include the row address decoder 330, the bank address decoder 350, a row block select circuit 420, a memory cell array 410, a sense amplifier 411, an interface circuit 430, a row decoder 440, a column decoder 450, an I/O gating circuit 460, and a data I/O buffer 470. The row address decoder 330, the bank address decoder 350, and the row block select circuit 420 may be formed in the pad region of the memory device 100.

The memory cell array 410 may include a plurality of memory cells MC. The memory cell array 410 may include 16 memory banks 410*a* to 410*p*. Although there are 16 memory banks (BankA to BankP) 410*a* to 410*p* illustrated in FIG. 4, the number of memory banks is not limited thereto. Each of the memory banks 410*a* to 410*p* may include a plurality of rows, a plurality of columns, and a plurality of memory cells MC arranged at intersections of the plurality of rows and the plurality of columns. The plurality of rows may be defined by a plurality of word lines WL, and the plurality of columns may be defined by a plurality of bit lines BL.

The row address decoder 330 may generate a decoded row address DRA and transmit the same to the row block select circuit 420. The decoded row address DRA of FIG. 4 may be the same as the decoded row address DRA of FIG. 3. The decoded row address DRA may include a decoded row address having a bit value of each bit of the row address RA, and a decoded row address having a complementary bit value of each bit of the row address RA.

The bank address decoder 350 may generate a decoded bank address DBA and transmit the same to the interface circuit 430. The decoded bank address DBA of FIG. 4 may be the same as the decoded bank address DBA of FIG. 3. The bank address decoder 350 may generate a plurality of decoded bank addresses DBA_a to DBA_p corresponding to the number of memory banks based on the bank address BA included in the internal command and address PCA signal. Each of the decoded bank addresses DBA_a to DBA_p may be a signal (e.g., a high level signal) for enabling the memory bank, or a signal (e.g., a low level signal) for disabling the memory bank. Only one of the decoded bank addresses DBA_a to DBA_p may be an enable signal, and the others may be a disable signal. In addition, the bank address decoder 350 may transmit each of the plurality of generated decoded bank addresses DBA_a to DBA_p to each of a plurality of interface circuits 430*a* to 430*p*.

The row block select circuit 420 may generate a global row group address GDRA and a plurality of global MUX activation signals GMX based on the received decoded row address DRA. The row block select circuit 420 may generate a global row group address GDRA141312 associated with one of eight groups of row blocks. The number of groups of row blocks may be changed according to continuity rules of row address coding and/or as need arises. In addition, the row block select circuit 420 may generate a plurality of global MUX activation signals GMX0/GMX1/GMX2 corresponding to the number of global MUXs. Each of the plurality of global MUX activation signals GMX0/GMX1/GMX2 may be a signal (e.g., a high level signal) for enabling the global MUX, or a signal (e.g., a low level signal) for disabling the global MUX. Only one of the plurality of global MUX activation signals GMX may be an enable signal, and the others may be a disable signal.

The row block select circuit 420 may transmit the generated global row group address GDRA141312 and the plurality of global MUX activation signals GMX0/GMX1/GMX2 to each of the plurality of interface circuits 430*a* to 430*p*. This will be described in more detail below with reference to FIGS. 5 to 7.

The interface circuit 430 may generate a local row group address LDRA and a plurality of local MUX activation signals LMX based on the global row group address GDRA and the plurality of global MUX activation signals GMX received from the row block select circuit 420 and the decoded bank address DBA received from the bank address decoder 350. One of the plurality of interface circuits 430 may receive a decoded bank address DBA associated with the enable signal and may generate the local row group address LDRA and the plurality of local MUX activation signals LMX. The one interface circuit that receives the decoded bank address DBA associated with the enable signal may transmit the generated local row group address LDRA and the plurality of local MUX activation signals LMX to an associated row decoder. For example, the others of the plurality of interface circuits 430 may receive a decoded bank address DBA associated with the disable signal and may not generate the local row group address LDRA and the plurality of local MUX activation signals LMX.

A local row group address LDRA141312 generated from the interface circuit 430 may be the same as the global row group address GDRA141312. In addition, each of a plurality of local MUX activation signals LMX0/LMX1/LMX2 generated from the interface circuit 430 may be the same as the plurality of global MUX activation signals GMX0/GMX1/GMX2.

Each of the plurality of interface circuits 430*a* to 430*p* corresponding to each of the plurality of memory banks 410*a* to 410*p* may be provided. Each of the interface circuits 430*a* to 430*p* may receive a corresponding decoded bank address DBA_a to DBA_p from the bank address decoder 350. In this case, each of the interface circuits 430*a* to 430*p* may determine whether to generate and transmit the local row group address LDRA and the plurality of local MUX activation signals LMX based on the received decoded bank addresses DBA_a to DBA_p. This will be described in detail below with reference to FIG. 8. FIG. 4 illustrates a plurality of interface circuits, but the present invention is not limited thereto, and a single interface circuit may be implemented.

Although not illustrated in FIG. 4, the interface circuit 430 may receive a decoded column address DCA from a column address decoder (not illustrated) and generate a signal associated with the column decoder 450 based on the decoded column address DCA. In addition, the interface circuit 430 may transmit the generated signal to the column decoder 450.

The row decoder 440 may activate a specific row of the plurality of rows of the memory cell array 410 based on the local row group address LDRA141312 and the plurality of local MUX activation signals LMX0/LMX1/LMX2 transmitted from the interface circuit 430. The row decoder 440 may transmit a control signal to a word line driver of a word line associated with the specific row to be activated to drive the corresponding word line driver. For example, the word line driver may be a sub-word line driver.

The row decoder 440 may include a plurality of row decoders 440*a* to 440*p*. Each of the plurality of row decoders 440*a* to 440*p* corresponding to each of the plurality of memory banks 410*a* to 410*p* may be provided. Each of the row decoders 440*a* to 440*p* may activate a specific row in response to the local row group address LDRA141312 and the plurality of local MUX activation signals LMX0/LMX1/LMX2 received through the corresponding interface circuit 430*a* to 430*p*.

The column decoder 450 may select a column to be activated from among a plurality of columns of the memory cell array 410 based on the signal received from the interface circuit 430. To this end, the column decoder 450 may activate the sense amplifier 411 through the I/O gating circuit 460. Similarly to the row decoder 440, each of the plurality of column decoders 450*a* to 450*p* and each of the plurality of sense amplifiers 411*a* to 411*p* corresponding to each of the plurality of memory banks 410*a* to 410*p* may be provided.

The I/O gating circuit 460 may gate input and output data, and include a data latch for storing data read from the memory cell array 410, and a write driver for writing data to the memory cell array 410. The data read from the memory cell array 410 may be sensed by the sense amplifier 411 and stored in the I/O gating circuit 460 (e.g., data latch).

The data read from the memory cell array 410 (e.g., the data stored in the data latch) may be provided to the memory controller through the data I/O buffer 470. Data to be written in the memory cell array 410 may be provided from the memory controller to the data I/O buffer 470, and the data provided to the data I/O buffer 470 may be provided to the I/O gating circuit 460.

Figure 5:
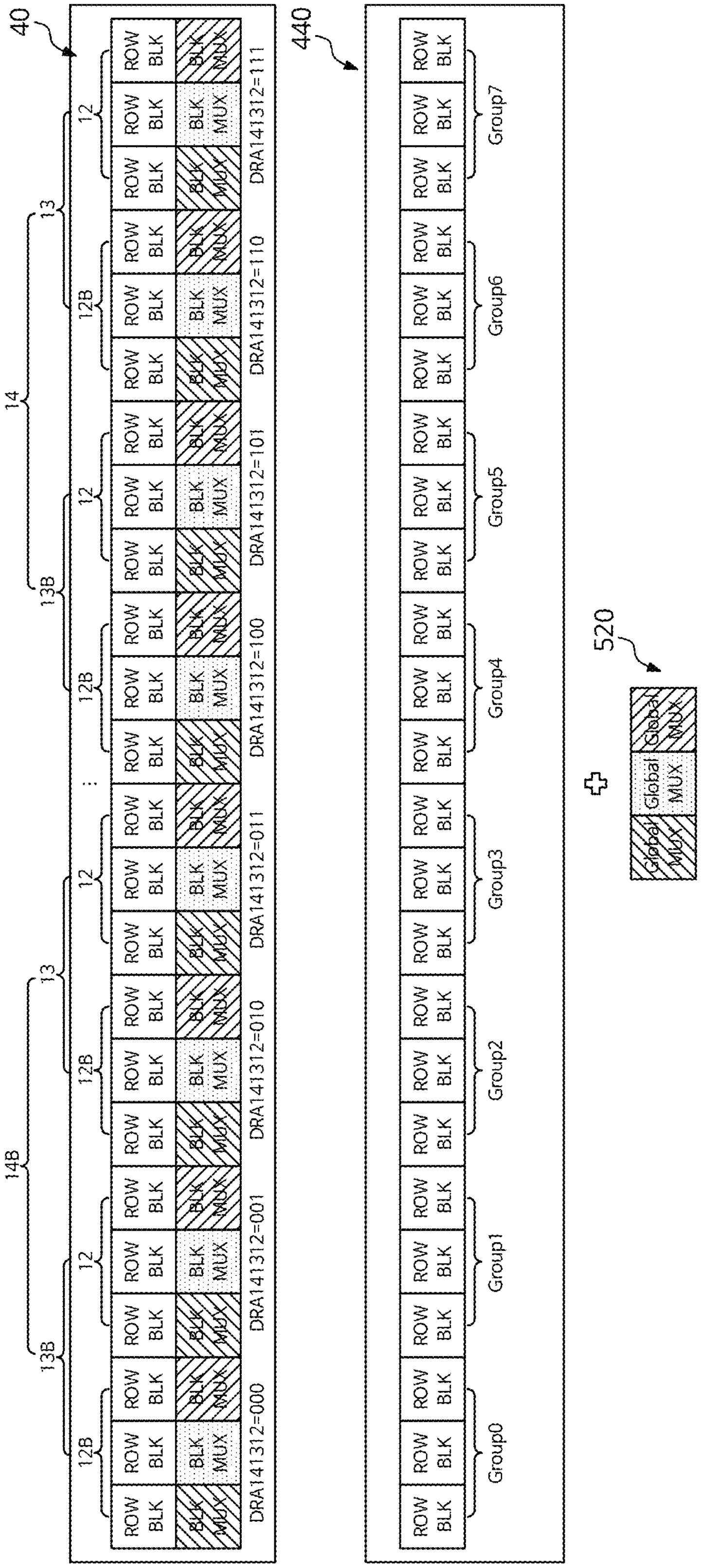
FIG. 5 is a diagram illustrating an example of a row decoder of the memory device according to an embodiment.

FIG. 5 is a diagram illustrating an example of a row decoder of the memory device according to an embodiment. Referring to FIG. 5, a first row decoder 40 and a second row decoder 440 are provided. The first row decoder 40 may be a comparative example and the second row decoder 440 may be the same as the row decoder 440 of FIG. 4. Each of the first and second row decoders 40 and 440 may include a plurality of row blocks Row BLK. Each of the row blocks may control a global word line in a sub-array and may be connected to a block MUX. For example, each of the row blocks may be connected to one block MUX in the first row decoder 40 or a global MUX. The block MUX may include a plurality of AND gate logics for enabling a row block corresponding to the decoded row address DRA. The number of row blocks included in the row decoder may be determined by the following equation.

$$\text{number of } BLKs = \frac{\text{density}/nBanks}{\frac{c}{wl} * \frac{c}{bl} * nDQs} \qquad \text{[Equation 1]}$$

where, density may represent a capacity of a memory, and nBanks may represent the number of memory banks. In addition, c/wl may represent the number of memory cells per word line, c/bl may represent the number of memory cells per bit line, nDQs may represent the number of DQs, and number of BLKs may represent the number of row blocks required for one row decoder.

For example, if the capacity of the memory is 8 GB (2^30), the number of memory banks is 16, c/wl is 1,024, c/bl is 1,376, and DQ is 16, then the number of required row blocks is about 23.81, and accordingly, the number of row blocks required for one row decoder can be calculated as 24.

The first row decoder 40 represents an example in which the number of block MUXs used is the same as the row blocks. In the first row decoder 40, the number of row blocks and the number of block MUXs may be the same as each other, and each row block may be connected to each block MUX in a one-to-one manner. For example, if 24 row blocks and 16 memory banks are used, a total of 384 block MUXs may be used. In FIG. 5, the first row decoder 40 includes 24 row blocks and 24 block MUXs, but the number of row blocks and block MUXs are not limited thereto.

The coding of the row address associated with the row block in the first row decoder 40 may have continuity. For example, the three leftmost row blocks in the first row decoder 40 may be associated with a decoded row address DRA141312-000 in which the most significant bits (e.g., bits 14, 13, and 12) are "000". On the other hand, the three rightmost row blocks in the first row decoder 40 may be associated with a decoding row address DRA141312=111 in which the most significant bits are "111". In addition, the block MUX connected to each row block may also have a continuity that is repeated in units of three.

The second row decoder 440 represents an example in which the row blocks are divided into a plurality of groups (e.g., eight groups) based on the coding continuity of the row address associated with the row block described above, while incorporating the block MUXs therein. The plurality of row blocks in the second row decoder 440 may be divided into a plurality of groups. Each of the plurality of groups includes a predetermined number of row blocks (e.g., three row blocks) therein. The predetermined number of row blocks in each group may be equal to the number of global MUXs. FIG. 5 illustrates that the second row decoder 440 includes 24 row blocks which are divided into a total of 8 groups on the basis of 3 units, but the number of row blocks, grouping units, and the number of groups are not limited thereto.

In addition, in the second row decoder 440, the block MUXs of the first row decoder 40 may be integrated into a plurality of global MUXs 520 using the continuity of row address coding. In an embodiment, the plurality of global MUXs 520 may be positioned in the pad region of the memory device rather than a region of the row decoder 440. In this case, the row block select circuit 420 of FIG. 4 may include the plurality of global MUXs 520. In an embodiment, the row blocks present in the second row decoder 440 may be connected to the plurality of global MUXs 520 in a one-to-many manner.

In this case, the number of global MUXs in the plurality of global MUXs 520 may be less than the number of row blocks present in the second row decoder 440. In addition, the number of row blocks in one group may be equal to the number of global MUXs in the plurality of global MUXs 520. In this case, the number of row blocks in the plurality of row blocks included in the second row decoder 440 may be equal to the product of the number of global MUXs in the plurality of global MUXs 520 and the number of groups. Although FIG. 5 illustrates that the number of global MUXs in the plurality of global MUXs 520 is 3, any number of global MUXs may be used according to the continuity rule of row address coding and/or as need arises.

With the configuration of the second row decoder 440, the number of block MUXs present in the memory device can be reduced and accordingly, the surface area of the row decoder can be reduced. For example, while the first row decoder 40 uses 384 block MUXs, the second row decoder 440 uses three global MUXs, thereby greatly reducing the number of block MUXs in the memory device. In addition, by reducing the area of the row decoder and memory device, activation power required for the row activation can be reduced, and unnecessary leakage current and signal skew that can occur when the row decoder occupies a large area can be reduced.

In addition, with the configuration of the second row decoder 440, the number of global MUXs in the plurality of global MUXs 520 can be implemented in a minimum unit that is smaller than the total number of row blocks by using the continuity of row address coding. For example, if the number of row blocks included in the second row decoder 440 doubles from 24 to 48, the group of row blocks will increase from 8 to 16, but as long as the continuity of row address coding is maintained, the number of global MUXs in the plurality of global MUXs 520 may be the same as 3. Accordingly, scalability of the memory device including the block MUXs and the row blocks can be secured.

Figure 6:
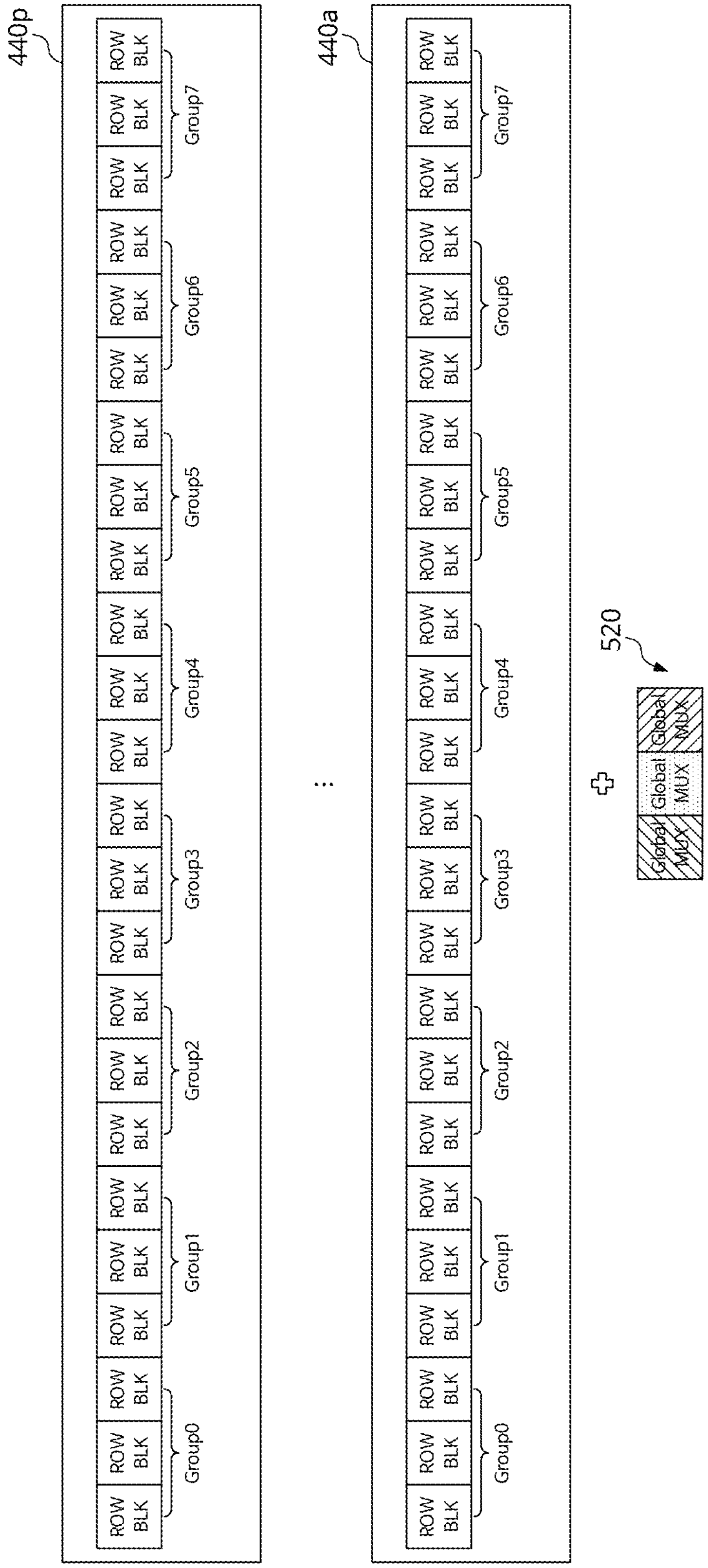
FIG. 6 is a diagram illustrating an example of a plurality of row decoders of the memory device according to an embodiment.

FIG. 6 is a diagram illustrating an example of the plurality of row decoders according to an embodiment. Referring to FIG. 6, the plurality of global MUXs 520 are connected to the plurality of row decoders 440*a* to 440*p*. A plurality of row blocks included in each of the plurality of row decoders 440*a* to 440*p* may be divided into a plurality of groups (e.g., eight groups). Each of the plurality of groups may include a first row block, a second row block, and a third row block.

Each global MUX of the plurality of global MUXs 520 may be connected to each of the plurality of row blocks included in each of the plurality of groups. For example, a first global MUX of the plurality of global MUXs 520 may be connected to the first row block of each of the plurality of groups. In addition, a second global MUX of the plurality of global MUXs 520 may be connected to the second row block of each of the plurality of groups. In addition, a third global MUX of the plurality of global MUXs 520 may be connected to the third row block of each of the plurality of groups.

Each global MUX of the plurality of global MUXs 520 may be connected to the row blocks included in different memory banks. For example, the first global MUX may be connected to the first row block of each of the 0th to 7th groups included in the plurality of row decoders 440*a* to 440*p*. The second global MUX may be connected to the second row block of the 0th to 7th groups included in the plurality of row decoders 440*a* to 440*p*. The third global MUX may be connected to the third row block of the 0th to 7th groups included in the plurality of row decoders 440*a* to 440*p*. With this configuration, even if the number of memory banks increases, the number of global MUXs can be maintained as long as code continuity is maintained.

Figure 7:
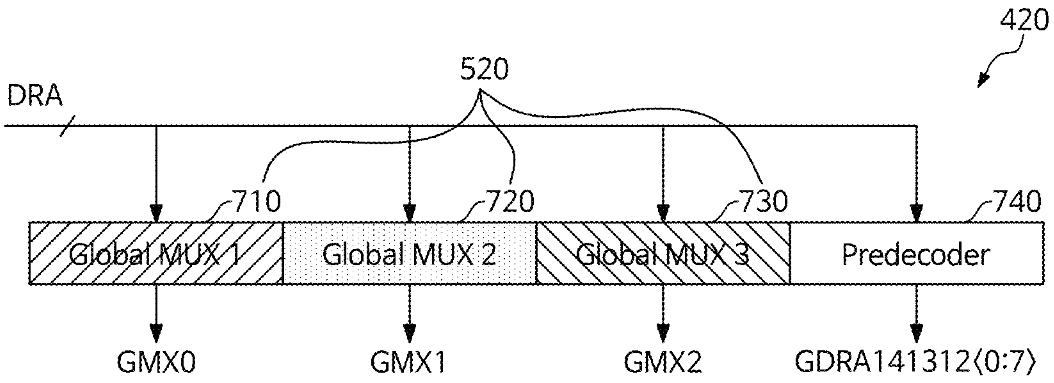
FIG. 7 is a diagram illustrating an example of a row select circuit of the memory device according to an embodiment.

FIG. 7 is a diagram illustrating an example of the row select circuit of the memory device according to an embodiment. Referring to FIG. 7, the row block select circuit 420 generates a global row group address GDRA141312 and a plurality of global MUX activation signals GMX0/GMX1/GMX2. The row block select circuit 420 may include a plurality of global MUXs 520 and a predecoder 740. It is illustrated that the plurality of global MUXs 520 include a first global MUX 710, a second global MUX 720, and a third global MUX 730, but the present invention is not limited thereto, and any number of global MUXs may be used according to the continuity rules of row address coding and/or as need arises.

The row block select circuit 420 may generate a plurality of global MUX activation signals GMX0/GMX1/GMX2 based on the decoded row address DRA. The first global MUX 710 may generate a first global MUX activation signal GMX0 based on the decoded row address DRA. The second global MUX 720 may generate a second global MUX activation signal GMX1 based on the decoded row address DRA. The third global MUX 730 may generate a third global MUX activation signal GMX2 based on the decoded row address DRA.

Figure 8:
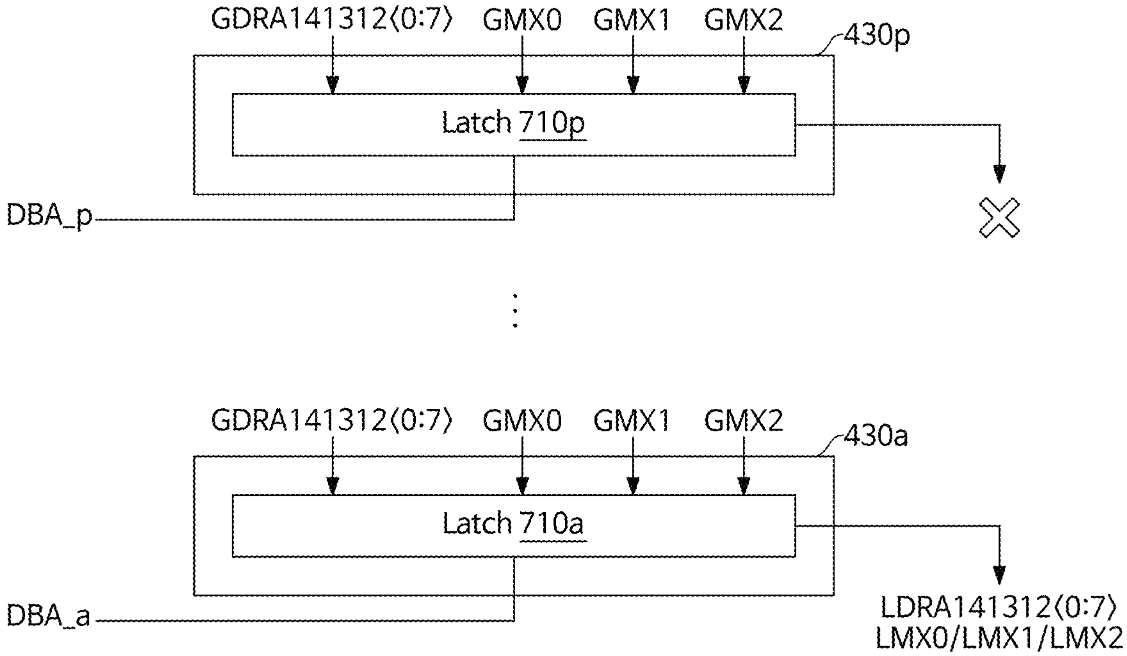
FIG. 8 is a diagram illustrating an example of a plurality of interface circuits according to an embodiment.

The row block select circuit 420 may generate a global row group address GDRA based on the decoded row address DRA. The global row group address GDRA may be associated with a specific group of the plurality of groups. The predecoder 740 may generate a global row group address GDRA based on a predetermined number of most significant bits (MSBs) of the decoded row address. For example, the predecoder 740 may generate a global row group address GDRA141312 associated with one of the eight groups associated with the row blocks based on three most significant bits (e.g., bits 14, 13, and 12). The predetermined number of most significant bits may be determined based on the number of groups associated with the row blocks. FIG. 8 is a diagram illustrating an example of the plurality of interface circuits according to an embodiment. Each of the plurality of interface circuits 430*a* to 430*p* may include a corresponding one of latches 710*a* to 710*p*. Referring to FIG. 8, each of the plurality of interface circuits 430*a* to 430*p* may generate a local row group address LDRA and a plurality of local MUX activation signals LMX0/LMX1/LMX2.

Each of the interface circuits 430*a* to 430*p* may generate a local row group address LDRA141312 and a plurality of local MUX activation signals LMX0/LMX1/LMX2 based on the global row group address GDRA141312, the plurality of global MUX activation signals GMX0/GMX1/GMX2, and a corresponding one of the decoded bank addresses DBA_a to DBA_p. Specifically, if the decoded bank addresses DBA_a to DBA_p are associated with an enable signal (e.g., a high level signal), the interface circuits 430*a* to 430*p* may generate the local row group address LDRA141312 and the plurality of local MUX activation signals LMX0/LMX1/LMX2 and transmit the generated address and signals to the associated row decoders. On the other hand, if the decoded bank addresses DBA_a to DBA_p are associated with a disable signal (e.g., a low level signal), the interface circuits 430*a* to 430*p* may not generate the local row group address LDRA141312 and the plurality of local MUX activation signals LMX0/LMX1/LMX2 and/or not transmit the address and signals to the associated row decoders.

In the illustrated example, the decoded bank address DBA_a may be associated with the enable signal, and the others DBA_b to DBA_p of the decoded bank addresses may be associated with the disable signal. In this case, the first latch 710*a* included in the first interface circuit 430*a* may generate the local row group address LDRA141312 and a plurality of local MUX activation signals LMX0/LMX1/LMX2 and transmit the generated address and signals to the row decoder 440*a*. On the other hand, the latches 720*b* to 710*p* included in the second to sixteenth interface circuits 430*b* to 430*p* may not generate a local row group address and a plurality of local MUX activation signals or may not transmit the address and signals to the row decoders 440*b* to 440*p*.

The local row group address LDRA141312 may be associated with a specific group of the plurality of groups. In addition, the plurality of local MUX activation signals LMX0/LMX1/LMX2 may be associated with one of the row blocks included in a specific group. For example, the first local MUX activation signal LMX0 may be associated with the first row block included in the specific group. The second local MUX activation signal LMX1 may be associated with the second row block included in the specific group. The third local MUX activation signal LMX2 may be associated with the third row block included in the specific group. If the plurality of local MUX activation signals LMX0/LMX1/LMX2 are associated with an enable signal, a disable signal, and a disable signal, respectively, the plurality of local MUX activation signals LMX0/LMX1/LMX2 may be associated with the first row block of the three row blocks included in the specific group.

Figure 9:
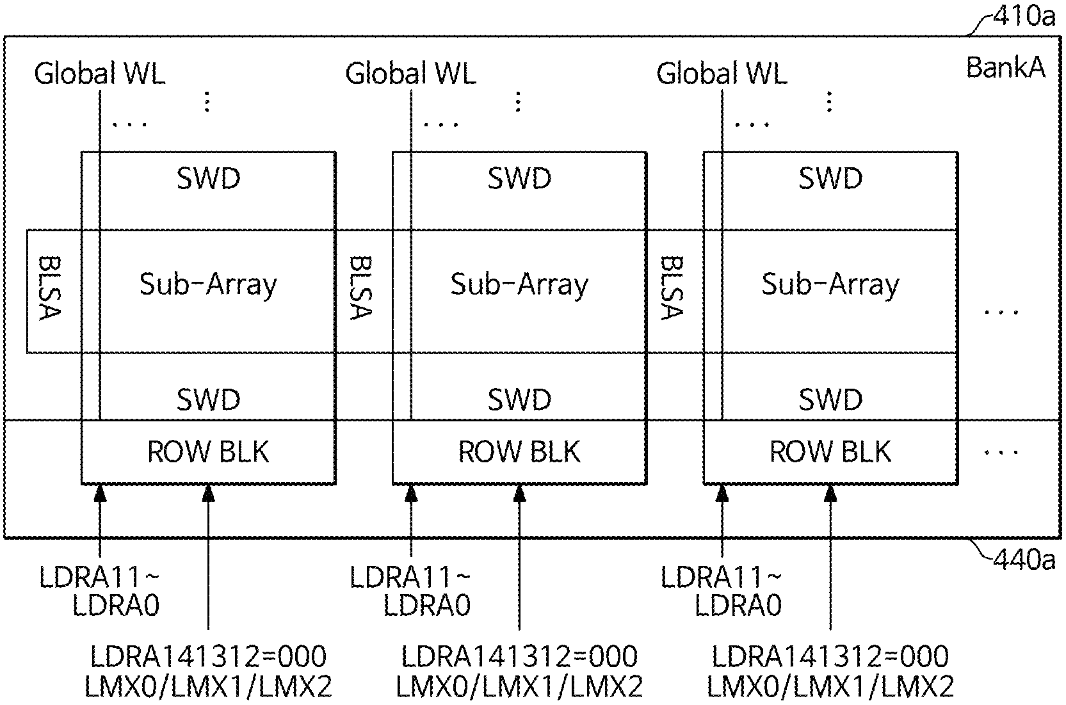
FIG. 9 is a diagram illustrating an example of a memory bank of the memory device according to an embodiment.

FIG. 9 is a diagram illustrating an example of the memory bank 410*a*. The memory bank 410*a* may include a plurality of sub-arrays, bit line sense amplifier regions BLSA, and sub-word line driver regions SWD. The bit line sense amplifier region BLSA may include a plurality of bit line sense amplifiers that sense and amplify data stored in memory cells and transmit data values to the outside, and may be disposed on one side of the sub-array. The sub-word line driver region SWD may include a plurality of sub-word line drivers that controls a voltage applied to the word line connected to the memory cells, and may be disposed on another side not facing the one side of the sub-array.

The sub-array may include a plurality of global word lines, and the plurality of global word lines may be controlled by a row block included in the row decoder 440*a*. A specific row block of the row blocks included in the row decoder 440*a* may be activated based on the local row group address LDRA141312 and the plurality of local MUX activation signals LMX0/LMX1/LMX2, and the activated specific row block may activate the global word line.

As illustrated, a plurality of row blocks in the same group may receive the same local row group address LDRA141312-000 and a plurality of same local MUX activation signals LMX0/LMX1/LMX2. If the local row group address LDRA141312 is 000, one of the first group row blocks (e.g., the three row blocks in the case of illustration) of the plurality of row blocks included in the row decoder 440*a* may be activated. Specifically, if the plurality of local MUX activation signals LMX0/LMX1/LMX2 are associated with the first row block, the first row block of the first group of row blocks may be activated. If the plurality of local MUX activation signals LMX0/LMX1/LMX2 are associated with the second row block, the second row block of the first group of row blocks may be activated. If the plurality of local MUX activation signals LMX0/LMX1/LMX2 are associated with the third row block, the third row block of the first group of row blocks may be activated.

In the example in which the first row block is activated, the first row block of the first group of row blocks may activate a global word line. In addition, the activated first row block may activate one of a plurality of local word lines associated with the global word line based on row addresses LDRA11 to LDRA0.

In an embodiment, each of the plurality of row blocks may receive the row addresses LDRA11 to LDRA0 from the I/O circuit 310 through the interface circuit 430.

In an embodiment, each of the plurality of row blocks may receive the row addresses LDRA11 to LDRA0 from the row address decoder 330. For example, the decoded row address DRA generated from the row address decoder 330 may include the row addresses LDRA11 to LDRA0.

Figure 10:
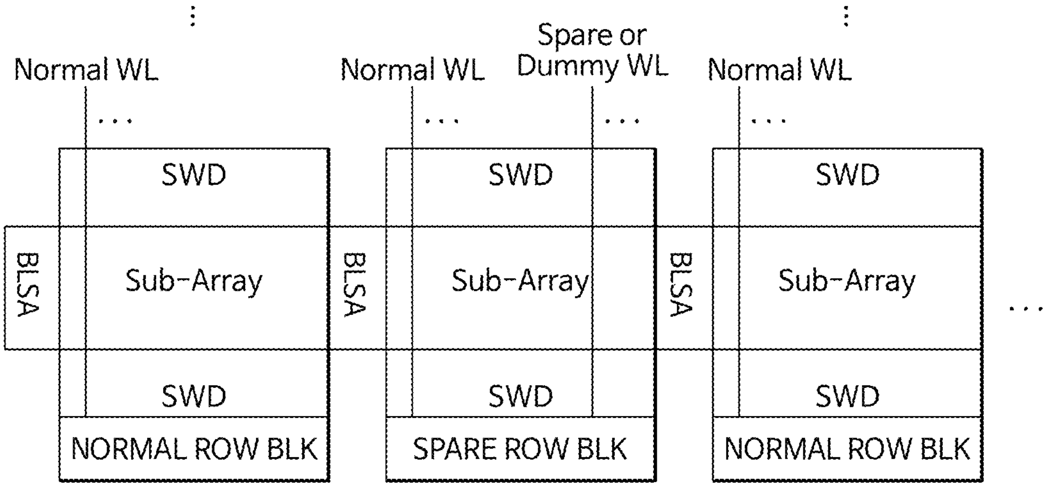
FIGS. 10 to 12 are diagrams illustrating examples of row blocks and global word lines of the memory device according to embodiments.
Figure 11:
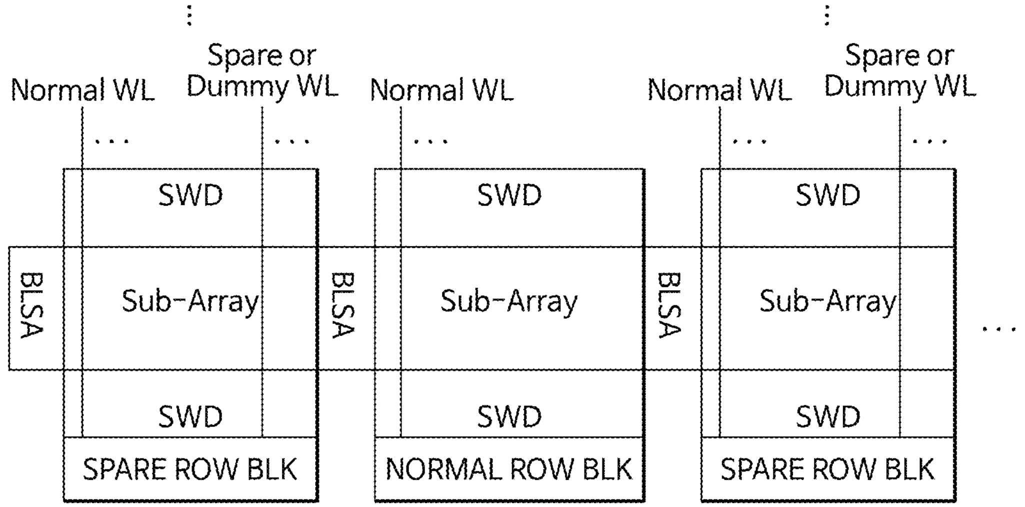
Figure 12:
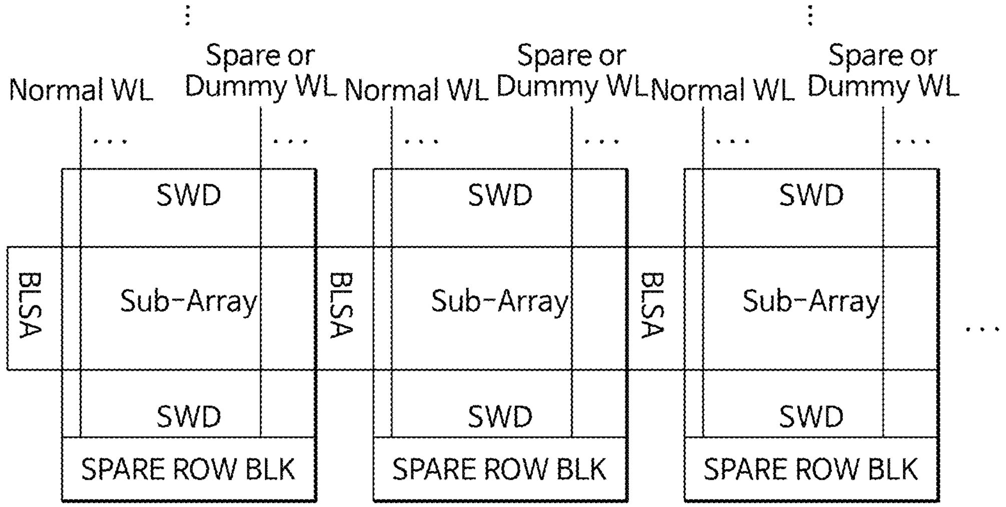

FIGS. 10 to 12 are diagrams illustrating examples of the row blocks and the global word lines.

Referring to FIG. 10, in each of the plurality of groups, two of the three row blocks positioned on both sides may be normal row blocks NORMAL ROW BLK, and the row block positioned at the center may be a spare row block SPARE ROW BLK.

Referring to FIG. 11, in each of the plurality of groups, two of the three row blocks ROW BLK positioned on both sides may be the spare row blocks, and the row block positioned at the center may be the normal row block. In this case, the edge row blocks positioned at the outermost sides of the plurality of row blocks included in the row decoder may be the spare row blocks.

Referring to FIG. 12, in each of the plurality of groups, all row blocks may be the spare row blocks. In this case, the edge row blocks positioned at the outermost sides of the plurality of row blocks included in the row decoder may be the spare row blocks.

In addition, although not illustrated, the row blocks may all be normal row blocks.

The global word line may include at least some of normal word lines, spare word lines, or dummy word lines. Herein, memory cells connected to a normal word line may store data, and memory cells connected to a spare word line or a dummy word line may not store data. The number of global word lines associated with one row block may be equal to the number of memory cells per bit line. For example, if the number of memory cells per bit line is 1,376, the number of global word lines associated with one row block may be 1,376.

In the normal row block, all global word lines to be controlled may be normal word lines. On the other hand, in the spare row block, the global word line to be controlled may be a spare word line and/or a dummy word line, and a normal word line. The spare row block may maintain the continuity of row address coding through the spare word line or the dummy word line even when the continuity of row address coding is broken by the number of memory cells per word line, the number of memory cells per bit line, the folding GBL, etc.

The number of spare word lines or dummy word lines included in the spare row block may vary according to the specification of the memory. If the type of memory is Low-Power Double Data Rate 5 (LPDDR5), the capacity of the memory is 8 GB, the C/WL of the memory is 1,024, the C/BL of the memory is 1,376, the number of banks in the memory is 16, and the number of DQs is 16, the number of spare word lines or dummy word lines included in the spare row block may be 32.

As described above, the row blocks included in the row decoder may be a normal row block and/or a spare row block, and with such a configuration, the continuity of the row blocks (or the continuity of the corresponding row address coding) may be maintained. Accordingly, a plurality of block MUXs connected to each of a plurality of row blocks included in the row decoder may be integrated based on the continuity of the row block and implemented as a global mux.

Figure 13:
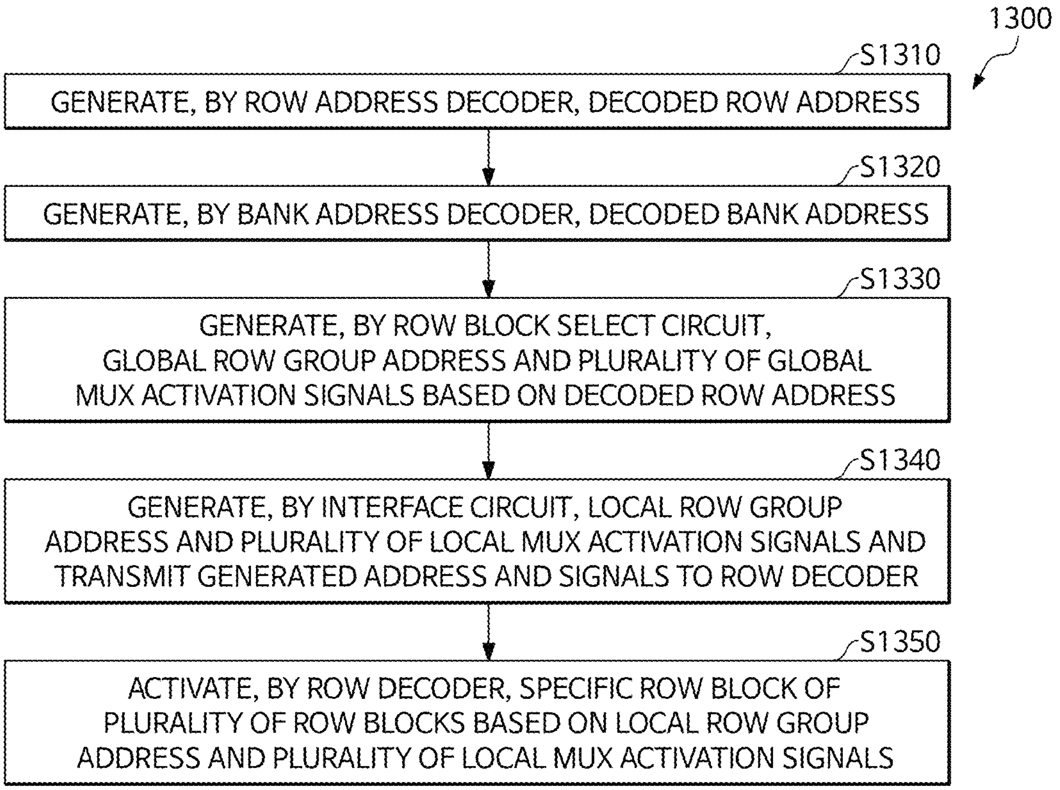
FIG. 13 is a flowchart illustrating a method for activating a row block of the memory device according to an embodiment.

FIG. 13 is a flowchart illustrating a method 1300 for activating a row block of a memory device according to an embodiment. Referring to FIG. 13, the method 1300 may be performed by a memory device (e.g., the memory device 100 of FIG. 4) including a row address decoder, a bank address decoder, a row block select circuit, and an interface circuit. The method 1300 may initiated by the row address decoder generating a decoded row address, in S1310. The decoded row address may include a global row group address and the other row addresses.

The bank address decoder may generate a decoded bank address, in S1320. The row block select circuit may generate a global row group address and a plurality of global MUX activation signals based on the decoded row address, in S1330.

The row block select circuit may include a predecoder and a plurality of global MUXs, and the number of global MUXs in the plurality of global MUXs may be less than the number of row blocks in the plurality of row blocks. In addition, the pre-decoder may generate a global row group address based on the decoded row address, and the plurality of global MUXs may generate a plurality of global MUX activation signals based on the decoded row address.

The predecoder may generate a global row group address based on a predetermined number of most significant bits of the decoded row address.

The interface circuit may generate a local row group address and a plurality of local MUX activation signals based on the global row group address, the plurality of global MUX activation signals, and the decoded bank address and transmit the generated address and signals to the row decoder, in S1340. The plurality of local MUX activation signals may be associated with one of the row blocks in a specific group. For example, in response to the decoded bank address being associated with the enable signal, the interface circuit may transmit the local row group address and the plurality of local MUX activation signals to the row decoder. On the other hand, in response to the decoded bank address being associated with the disable signal, the interface circuit may not transmit the local row group address and the plurality of local MUX activation signals to the row decoder.

The row decoder may activate a specific row block of the plurality of row blocks based on the local row group address and the plurality of local MUX activation signals, in S1350.

The activated specific row block may activate the global word line. For example, the activated specific row block may activate one of a plurality of local word lines associated with the global word line based on the other row addresses included in the decoded row address.

The flowchart illustrated in FIG. 13 and the above description are merely examples, and may be implemented differently in some other examples. For example, in some examples, the order of respective steps may be changed, some steps may be repeatedly performed, some steps may be omitted, or some steps may be added.

Figure 14:
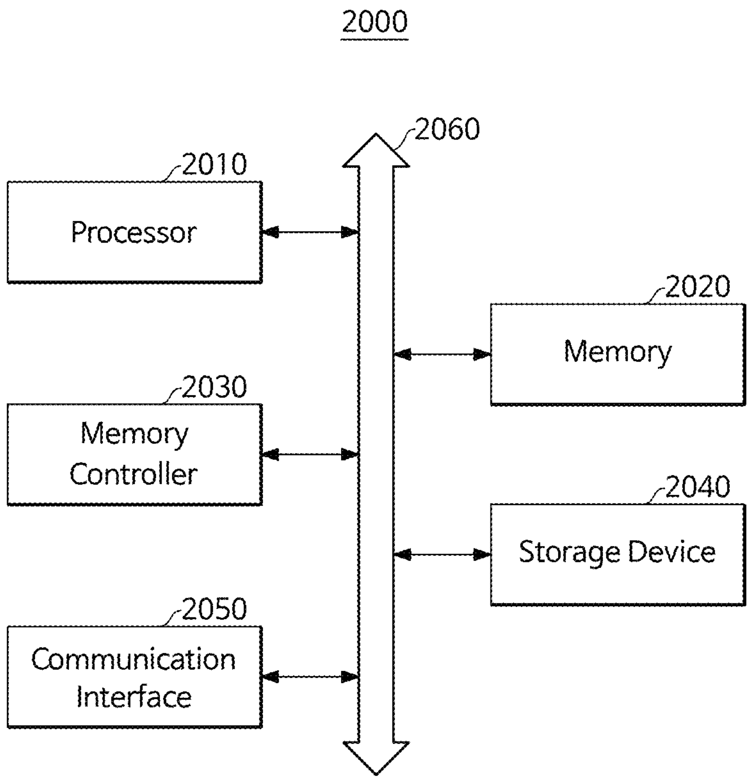
FIG. 14 is a diagram illustrating a computing device according to an embodiment.

FIG. 14 is a diagram illustrating a computing device 2000. Referring to FIG. 14, the computing device 2000 may include a processor 2010, a memory 2020, a memory controller 2030, a storage device 2040, a communication interface 2050, and a bus 2060. In addition to the illustrated configuration, the computing device 2000 may further include other general-purpose components.

The processor 2010 controls the overall operation of each component of the computing device 2000. The processor 2010 may be implemented as at least one of various processing units such as a central processing unit (CPU), an application processor (AP), a graphic processing unit (GPU), etc.

The memory 2020 may store various types of data and instructions. The memory 2020 may be implemented as the memory device described above with reference to FIGS. 1 to 12. The memory controller 2030 may control the transmission of data or instructions to and from the memory 2020. The memory controller 2030 may be provided as a chip separate from the processor 2010. Alternatively, the memory controller 2030 may be provided as an internal configuration of the processor 2010.

The storage device 2040 may non-temporarily store programs and data. The storage device 2040 may be implemented with a nonvolatile memory. The communication interface 2050 may support wired/wireless Internet communication of the computing device 2000. In addition, the communication interface 2050 may support various other communication methods in addition to the Internet communication. The bus 2060 may provide a communication function between components of the computing device 2000. The bus 2060 may include at least one type of bus according to the communication protocol between the components.

While the present invention has been described with reference to embodiments thereof, it will be apparent to those of ordinary skill in the art that various changes and modifications may be made thereto without departing from the spirit and scope of the present invention as set forth in the following claims.

What is claimed is:

1. A memory device, comprising:

a first memory bank including a plurality of first rows;

a first row decoder including a plurality of row blocks associated with the plurality of first rows and configured to activate a specific row block of the plurality of row blocks based on a local row group address and a plurality of local MUX activation signals;

an interface circuit configured to:

receive a global row group address, a plurality of global MUX activation signals, and a decoded bank address, generate the local row group address and the plurality of local MUX activation signals in response to the global row group address, the plurality of global MUX activation signals, and the decoded bank address, and transmit the local row group address and the plurality of local MUX activation signals to the first row decoder; and a row block select circuit configured to generate the global row group address and the plurality of global MUX activation signals based on a decoded row address.

2. The memory device according to claim 1, further comprising:

a command decoder configured to generate a first internal control signal and a second internal control signal based on an internal command;

a bank address decoder configured to generate the decoded bank address based on an internal address and the first internal control signal; and a row address decoder configured to generate the decoded row address based on the internal address and the second internal control signal.

3. The memory device according to claim 1, wherein the row block select circuit includes a predecoder and a plurality of global MUXs, and wherein a number of global MUXs in the plurality of global MUXs is less than a number of row blocks in the plurality of row blocks.

4. The memory device according to claim 3, further comprising:

a second memory bank including a plurality of second rows; and a second row decoder including a plurality of row blocks associated with the plurality of second rows, wherein each of the plurality of global MUXs is connected to row blocks included in different memory banks.

5. The memory device according to claim 3, wherein the predecoder is configured to generate the global row group address based on the decoded row address, and wherein the plurality of global MUXs are configured to generate the plurality of global MUX activation signals based on the decoded row address.

6. The memory device according to claim 5, wherein the predecoder is configured to generate the global row group address based on a predetermined number of most significant bits (MSBs) of the decoded row address.

7. The memory device according to claim 3, wherein the plurality of row blocks are divided into a plurality of groups, and wherein the global row group address is associated with a specific group of the plurality of groups.

8. The memory device according to claim 7, wherein each of the plurality of groups includes a predetermined number of row blocks, and wherein the predetermined number of row blocks is the same as a number of global MUXs in the plurality of global MUXs.

9. The memory device according to claim 8, wherein a number of the plurality of row blocks is the same as a product of the number of global MUXs in the plurality of global MUXs and a number of groups.

10. The memory device according to claim 7, wherein the plurality of global MUXs include a first global MUX and a second global MUX, wherein the first global MUX is connected to a first row block in each of the plurality of groups, and wherein the second global MUX is connected to a second row block in each of the plurality of groups.

11. The memory device according to claim 7, wherein the plurality of local MUX activation signals are associated with one of row blocks included in the specific group.

12. The memory device according to claim 1, wherein the memory device is configured such that the activated specific row block activates a global word line.

13. The memory device according to claim 12, wherein the decoded row address includes the global row group address and the other row address, and wherein the memory device is configured such that the activated specific row block activates one of a plurality of local word lines associated with the global word line based on the other row address.

14. The memory device according to claim 1, wherein, in response to the decoded bank address being associated with an enable signal, the interface circuit is configured to transmit the local row group address and the plurality of local MUX activation signals to the first row decoder, and wherein, in response to the decoded bank address being associated with a disable signal, the interface circuit is configured not to transmit the local row group address and the plurality of local MUX activation signals to the first row decoder.

15. The memory device according to claim 1, wherein the specific row block is an edge row block of the plurality of row blocks, and wherein the edge row block includes at least one of a dummy bit word line or a spare bit word line, and a plurality of normal bit word lines.

16. A memory device, comprising:

a memory cell array including a first memory bank and a second memory bank, the first memory bank including a first set of rows and the second memory bank including a second set of rows;

a first row decoder including a first set of row blocks associated with the first set of rows, and configured to activate one of the first set of row blocks based on a local row group address and a plurality of local MUX activation signals;

a second row decoder including a second set of row blocks associated with the second set of rows, and configured to activate one of the second set of row blocks based on the local row group address and the plurality of local MUX activation signals;

an interface circuit configured to:

receive a global row group address, a plurality of global MUX activation signals, and a decoded bank address, generate the local row group address and the plurality of local MUX activation signals in response to the global row group address, the plurality of global MUX activation signals, and the decoded bank address, and transmit the local row group address and the plurality of local MUX activation signals to the first row decoder or the second row decoder; and a row block select circuit configured to generate the global row group address and the plurality of global MUX activation signals based on a decoded row address.

17. The memory device according to claim 16, wherein the decoded bank address includes a first decoded bank address associated with the first memory bank and a second decoded bank address associated with the second memory bank, and wherein, in response to the first decoded bank address being associated with an enable signal and the second decoded bank address being associated with a disable signal, the interface circuit is configured to transmit the local row group address and the plurality of local MUX activation signals to only the first row decoder.

18. The memory device according to claim 16, wherein the row block select circuit includes a predecoder and a plurality of global MUXs, wherein each of the first set of row blocks and the second set of row blocks is divided into a plurality of groups, and each of the plurality of global MUXs is connected to row blocks included in different groups.

19. The memory device according to claim 18, wherein each of the plurality of global MUXs is connected to row blocks included in the first and second memory banks.

20. A memory device, comprising:

a memory cell array including a plurality of rows;

a row decoder including a plurality of row blocks associated with the plurality of rows, and configured to activate a specific row block of the plurality of row blocks based on a row group address and a plurality of MUX activation signals; and a row block select circuit configured to generate the row group address and the plurality of MUX activation signals based on a decoded row address, wherein the plurality of row blocks are divided into a plurality of groups, and wherein each of the plurality of groups includes a predetermined number of row blocks among the plurality of row blocks, wherein the row decoder is configured to activate the activated-specific row block among the predetermined number of row blocks in response to one of the plurality of MUX activation signals, wherein the row block select circuit includes:

a predecoder configured to generate the row group address, and a plurality of global MUKs configured to generate the plurality of MUX activation signals, and wherein a number of global MUXs in the plurality of global MUXs is less than a number of row blocks in the plurality of row blocks.

* * * * *